(12) United States Patent
Ou et al.

(10) Patent No.: US 10,858,728 B2
(45) Date of Patent: Dec. 8, 2020

(54) PHASE-CHANGE TYPE VANADIUM OXIDE MATERIAL AND PREPARATION METHOD THEREFOR

(71) Applicant: SHANGHAI INSTITUTE OF MICROSYSTEM AND INFORMATION TECHNOLOGY, CHINESE ACADEMY OF SCIENCES, Shanghai (CN)

(72) Inventors: Xin Ou, Shanghai (CN); Qi Jia, Shanghai (CN); Kai Huang, Shanghai (CN); Xi Wang, Shanghai (CN)

(73) Assignee: SHANGHAI INSTITUTE OF MICROSYSTEM AND INFORMATION TECHNOLOGY, CHINESE ACADEMY OF SCIENCE, Shanghai (CN)

( * ) Notice: Subject to any disclaimer, the term of this patent is extended or adjusted under 35 U.S.C. 154(b) by 129 days.

(21) Appl. No.: 15/755,298

(22) PCT Filed: Jan. 6, 2016

(86) PCT No.: PCT/CN2016/070278
§ 371 (c)(1),
(2) Date: Aug. 2, 2018

(87) PCT Pub. No.: WO2017/031925
PCT Pub. Date: Mar. 2, 2017

(65) Prior Publication Data
US 2018/0327894 A1 Nov. 15, 2018

(30) Foreign Application Priority Data
Aug. 24, 2015 (CN) .......................... 2015 1 0524327

(51) Int. Cl.
*C23C 14/48* (2006.01)
*C23C 14/58* (2006.01)
(Continued)

(52) U.S. Cl.
CPC .......... *C23C 14/083* (2013.01); *C23C 14/042* (2013.01); *C23C 14/48* (2013.01); *C23C 14/5806* (2013.01)

(58) Field of Classification Search
CPC ..... C23C 14/083; C23C 14/042; C23C 14/48; C23C 14/5806
See application file for complete search history.

(56) References Cited

U.S. PATENT DOCUMENTS

| | | | |
|---|---|---|---|
| 6,358,307 B1 * | 3/2002 | Legrand | C09D 7/68 106/479 |
| 2010/0233874 A1 * | 9/2010 | Ito | H01L 21/76823 438/600 |
| 2010/0243896 A1 * | 9/2010 | Geneczko | G01J 5/023 250/338.1 |

FOREIGN PATENT DOCUMENTS

| | | |
|---|---|---|
| CN | 1800440 A | 7/2006 |
| CN | 101471421 A | 7/2009 |

(Continued)

OTHER PUBLICATIONS

Modifications in the phase transition properties of predeposited VO2 films. F. Cadrillo Case. 1984. Journal of Vacuum Science & Technology A 2, 1509 (Year: 1984).*

(Continued)

*Primary Examiner* — Dah-Wei D. Yuan
*Assistant Examiner* — Kristen A Dagenais-Englehart
(74) *Attorney, Agent, or Firm* — Global IP Services; Tianhua Gu

(57) ABSTRACT

A phase-transition type vanadium oxide material and a preparation method therefor. The preparation method
(Continued)

includes the following steps: providing a vanadium oxide base material, and implanting gaseous ions into the vanadium oxide base material, to obtain a phase-transition type vanadium oxide material having a preset phase-transition temperature. Subsequently, optionally, further annealing may be performed to adjust a bubble generation status in vanadium oxide after the gaseous ions are implanted, to further adjust the stress and strain and the phase-transition temperature. The method for preparing a phase-transition type vanadium oxide material consistent with the present invention has simple steps, desirable process reproducibility, high flexibility, and the phase-transition temperature of vanadium oxide can be continuously adjusted by changing an implantation dosage of the gaseous ions. In addition, the present invention has desirable compatibility, and can be combined with other phase-transition temperature methods, to achieve a larger phase-transition temperature adjustment range.

14 Claims, 2 Drawing Sheets

(51) Int. Cl.
*C23C 14/04* (2006.01)
*C23C 14/08* (2006.01)

(56) References Cited

FOREIGN PATENT DOCUMENTS

| CN | 105088166 A | 11/2015 |
| WO | WO 2008004787 | 1/2008 |

OTHER PUBLICATIONS

F. Cardillo Case. Modifications in the Phase Transition Properties of Predeposited VO2 films. AVS: Science & Technology of Materials, Interfaces and Processing. Journal of Vacuum Science & Technology A 2, 1509 (1984). (Year: 1984).*

Case, F.e.; "Modifications in the Phase Transition Properties of Predeposited V02 Films", 1-15 Journal of Vacuum Science & Technology A, vol. 2, No. 4, Dec. 31, 1984 (Dec. 31, 1984), ISSN: 0734-2101, pp. 1509-1512.

* cited by examiner

PHASE-CHANGE TYPE VANADIUM OXIDE MATERIAL AND PREPARATION METHOD THEREFOR

CROSS REFERENCE TO RELATED PATENT APPLICATION

The present application is the US national stage of PCT/CN2016/070278 filed on Jan. 6, 2016, which claims the priority of the CN2015105243273 filed on Aug. 24, 2015, which application is incorporated herein by reference.

BACKGROUND OF THE PRESENT INVENTION

Field of Invention

The present invention belongs to the field of functional materials, and relates to a phase-transition type vanadium oxide material and a preparation method therefor.

Description of Related Arts

Metal vanadium may react with oxygen to form a complex vanadium oxide system whose stoichiometric ratio has various forms. Most vanadium oxides may undergo an insulator-metal transition by thermal excitation and have different phase-transition temperatures. In all types of vanadium oxide, vanadium dioxide ($VO_2$) has aroused wide concern of scientific research personnel because vanadium dioxide has remarkable and reversible metal-insulator transition (MIT) phase-transition performance at approximately 68° C. and vanadium dioxide phase-transition temperature is closest to the room temperature.

In a phase transition process, a crystal structure of vanadium dioxide transits between a monoclinic structure (at a low temperature) and a square rutile structure (at a high temperature), and many physical properties, such as resistivity, transmittance, and magnetic susceptibility, of vanadium dioxide abruptly change. Especially, changes of optical transmittance/reflectivity in infrared bands are most obvious, and an abrupt change of resistivity reaches 4 to 5 orders of magnitude. Because the phase-transition temperature of vanadium dioxide is close to the room temperature and the physical properties of vanadium dioxide undergo significant abrupt change before and after the phase transition, vanadium dioxide has a very wide application prospect. However, during actual application, the temperature of vanadium dioxide usually needs to be adjusted to a particular temperature, to meet requirements of application. Especially, in the fields of smart windows, photoelectric switches, infrared detection, tera-hertz, and the like, the phase-transition temperature of vanadium dioxide that is higher than the room temperature becomes a greatest obstacle in the actual application of vanadium dioxide. How to decrease the phase-transition temperature of vanadium dioxide becomes a problem that needs to be resolved urgently.

Researchers found that the phase-transition temperature of vanadium dioxide can be regulated and controlled by doping metal ions into vanadium dioxide, introducing an inner/outer stress to vanadium dioxide, controlling a micro-appearance/defect of vanadium dioxide, and the like. For example, the phase-transition temperature of vanadium dioxide can be significantly decreased by doping tungsten ions into vanadium dioxide.

However, a current method process of adjusting the phase-transition temperature of vanadium oxide is complex, a temperature adjustment range is small, the phase-transition temperature cannot be continuously adjusted, and regional phase-transition temperature adjustment cannot be implemented.

Therefore, how to provide a phase-transition type vanadium oxide material and a preparation method therefor to resolve the foregoing problems becomes an important technical problem to be resolved urgently by a person skilled in the art.

SUMMARY OF THE PRESENT INVENTION

In view of the disadvantages of the prior art, an objective of the present invention is to provide a phase-transition type vanadium oxide material and a preparation method therefor, to resolve problems in the prior-art that a process of adjusting a phase-transition temperature of a vanadium oxide material is complex, a temperature adjustment range is small, the phase-transition temperature cannot be continuously adjusted, and regional phase-transition temperature adjustment cannot be implemented.

To achieve the foregoing objective and other related objectives, the present invention provides a method for preparing a phase-transition type vanadium oxide material, comprising the following steps:

providing a vanadium oxide base material, and implanting gaseous ions into the vanadium oxide base material, to obtain a phase-transition type vanadium oxide material having a preset phase-transition temperature.

Optionally, the gaseous ion comprises at least one of O, N, H, He, Ne, Ar, and Xe.

Optionally, the preset phase-transition temperature is regulated and controlled by adjusting an implantation dosage of the gaseous ions.

Optionally, the vanadium oxide base material is a thin film, a patterned nanostructure, or a block.

Optionally, after the gaseous ions are implanted into the vanadium oxide base material, to obtain the phase-transition type vanadium oxide material having a preset phase-transition temperature, the phase-transition type vanadium oxide material is ground into powder.

Optionally, the gaseous ions are implanted into the vanadium oxide base material by using a mask, to obtain the phase-transition type vanadium oxide material having a preset phase-transition temperature in a local region of the vanadium oxide base material.

Optionally, the material of the vanadium oxide base material comprises $VO_2$, $VO$, $V_2O_3$, or $V_2O_5$.

Optionally, the material of the vanadium oxide base material is pure phase vanadium oxide or doped vanadium oxide.

Optionally, the vanadium oxide base material is a vanadium dioxide thin film prepared on a substrate by using a magnetron sputtering method, an ion beam assisted deposition method, a chemical vapor deposition method, a vacuum thermal evaporation method, an electron beam evaporation method, a pulsed laser deposition method, or a solution-gel method.

Optionally, the substrate is quartz glass, ordinary glass, sapphire, a $TiO_2$ substrate, a mica plate, or a silicon wafer.

Optionally, the vanadium oxide base material is a vanadium dioxide thin film, and in a process of preparing the vanadium dioxide thin film, a phase-transition temperature of the vanadium dioxide thin film is regulated and controlled in advance by doping a sputtering target or by changing an oxygen pressure in the preparation process.

Optionally, after the gaseous ions are implanted into the vanadium oxide base material, to obtain the phase-transition type vanadium oxide material having a preset phase-transition temperature, the phase-transition type vanadium oxide material is further annealed.

Optionally, an annealing temperature range is 25° C. to 1000° C., and an annealing atmosphere comprises at least one of $O_2$ and Ar.

Optionally, a gaseous ion implantation energy range is 50 eV to 1 MeV, a gaseous ion implantation dosage range is 1E1 $cm^{-2}$ to 1E20 $cm^{-2}$, and a gaseous ion implantation temperature range is −100° C. to 1000° C.

The present invention further provides a phase-transition type vanadium oxide material prepared by using any method describe above.

As described above, the phase-transition type vanadium oxide material and the preparation method therefor consistent with the present invention have the following beneficial effects: (1) High flexibility: In the present invention, the gaseous ions are implanted into the vanadium oxide base material, and a stress and strain condition inside the vanadium oxide base material is changed, so that the phase-transition temperature of vanadium oxide is adjusted in an ideal direction. The implantation dosage of the gaseous ions is changed, so that the phase-transition temperature of vanadium oxide can be continuously adjusted. (2) Compatibility with other phase-transition temperature adjustment manners: The present invention is a post-treatment process, and the material of the vanadium oxide base material into which the gaseous ions are implanted may be pure phase vanadium oxide or vanadium oxide on which doping or other different processing is performed. Because the gaseous ions are implanted into a prepared vanadium oxide base material, the present invention can be compatible with a method for adjusting the phase-transition temperature such as a method of doping a sputtering target or changing an oxygen pressure in a process of preparing the vanadium oxide base material. The present invention is combined with other phase-transition temperature adjustment methods, so that a larger phase-transition temperature adjustment range can be achieved. (3) Capability of adjusting regional phase-transition temperature: Because in the present invention, the phase-transition temperature is adjusted by implanting the gaseous ions, the gaseous ions may be implanted, by using a mask, in a region that is of the entire vanadium oxide base material and in which the phase-transition temperature needs to be adjusted, thereby adjusting the regional phase-transition temperature of the vanadium oxide base material and providing a new direction for preparation of a vanadium oxide device. (4) Simple steps: Because only a step of implanting the gaseous ions is needed in an entire processing procedure in the present invention, there is no complex processing process, the operation is easy, and the process reproducibility is desirable. Certainly, subsequently, further annealing may be performed to adjust a bubble generation status in vanadium oxide after the gaseous ions are implanted, to further adjust the stress and strain and the phase-transition temperature.

LIST OF REFERENCE NUMERALS

1: Substrate
2: Vanadium dioxide thin film
3: Mask

DETAILED DESCRIPTION OF THE PREFERRED EMBODIMENTS

Implementations of the present invention are described below with reference to particular specific embodiments, and a person skilled in the art can easily learn other advantages and effects of the present invention based on the content disclosed in this specification. In addition, the present invention can be implemented or applied according to other specific implementations. Based on different opinions and applications, various modifications and variations may be made to all details in this specification without departing from the spirit of the present invention.

Refer to FIG. 1 to FIG. 4. It should be noted that, figures provided in the embodiments are merely used for schematically describing the basic concept of the present invention. Therefore, in the figure, only components related to the present invention are shown, and the present invention is not drawn according to the number, shape, and dimension of components used during actual implementation. During actual implementation of the present invention, the shape, number, and proportion of the components may be arbitrarily changed, and deployment of the components may be more complex.

Embodiment 1

The present invention provides a method for preparing a phase-transition type vanadium oxide material, comprising the following steps:

providing a vanadium oxide base material, and implanting gaseous ions into the vanadium oxide base material, to obtain a phase-transition type vanadium oxide material having a preset phase-transition temperature.

Specifically, the vanadium oxide base material may be in a form of a thin film, or in a form of a patterned nanostructure or a block. The material of the vanadium oxide base material may be $VO_2$, or other suboxides of vanadium such as VO, $V_2O_3$, or $V_2O_5$. These materials all have a semiconductor-metal phase transition feature.

Figure 1:
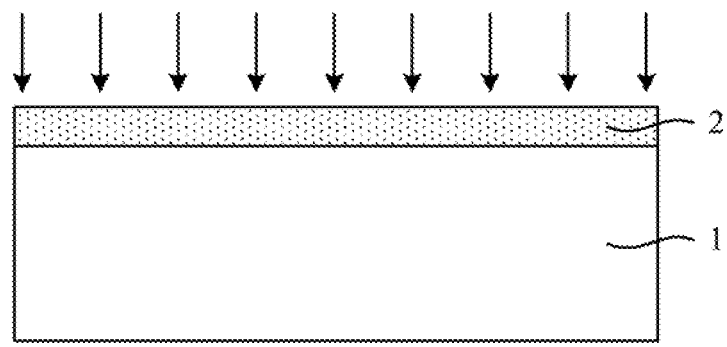
FIG. 1 is a schematic diagram of implanting, by using a method for preparing a phase-transition type vanadium oxide material consistent with the present invention, gaseous ions into a vanadium dioxide thin film formed on a substrate.

In an example, a vanadium dioxide thin film is used as the vanadium oxide base material. As shown in FIG. 1, a vanadium dioxide thin film 2 is first prepared on a substrate 1, and then gaseous ions are implanted into the vanadium dioxide thin film 2. The method for preparing the vanadium dioxide thin film 2 comprises but is not limited to a magnetron sputtering method, an ion beam assisted deposition method, a chemical vapor deposition method, a vacuum thermal evaporation method, an electron beam evaporation method, a pulsed laser deposition method, or a solution-gel method. The substrate 1 comprises but is not limited to quartz glass, ordinary glass, sapphire, a $TiO_2$ substrate, a mica plate, or a silicon wafer. The implanted gaseous ion comprises but is not limited to at least one of O, N, H, He, Ne, Ar, and Xe.

Specifically, gaseous ions implantation energy and types of implanted gaseous ion are related to the thickness of the thin film, and the implantation energy is generally 50 eV to 1 MeV. A gaseous ion implantation dosage range is 1E1 $cm^{-2}$ to 1E20 $cm^{-2}$, and a gaseous ion implantation temperature range is $-100°$ C. to $1000°$ C. Specifically, the implantation dosage may be adjusted according to a phase-transition temperature that needs to reach, and therefore, the protection scope of the present invention should not be strictly limited herein.

According to the present invention, the phase-transition temperature is changed by implanting ions into the vanadium oxide base material. The mechanism mainly is: Bubbles are generated in the vanadium oxide base material when the gaseous ions are implanted, and a stress and strain condition inside the vanadium oxide base material is changed, so that the phase-transition temperature of vanadium oxide is adjusted in an ideal direction.

It needs to be noted that, there is an essential difference between the present invention in which the phase-transition temperature of vanadium oxide is changed by implanting gaseous ions and the conventional technology in which the phase-transition temperature of vanadium oxide is changed by doping metal ions. In the conventional technology, after metal ions are implanted, the implanted metal ions replace some vanadium ions, thereby causing changes in valence states inside vanadium oxide, bringing in crystal defects, and causing undesirable impact on performance of vanadium oxide. However, in the present invention, the implanted gaseous ions cause changes in the stress and strain condition of vanadium oxide by using only pressure of gases inside vanadium oxide, to change the phase-transition temperature of vanadium oxide; and the implanted gaseous ions are zero valent, thereby neither causing changes in the valence states inside vanadium oxide nor causing undesirable impact on the performance of vanadium oxide.

Specifically, after the gaseous ion are implanted into the vanadium oxide base material to obtain the phase-transition type vanadium oxide material having a preset phase-transition temperature, the phase-transition type vanadium oxide material may be optionally annealed, to adjust a bubble generation status in vanadium oxide after the gaseous ions are implanted, so as to further adjust the stress and strain and the phase-transition temperature. An annealing temperature range is $25°$ C. to $1000°$ C., and an annealing atmosphere comprises at least one of $O_2$ and Ar.

Particularly, according to the present invention, the phase-transition temperature of vanadium oxide can be continuously adjusted by changing the implantation dosage of the gaseous ions, and a decrease amplitude of the phase-transition temperature may reach $0°$ C. to $80°$ C., or even higher.

In an example, an epitaxial pure-phase vanadium dioxide thin film having a thickness of 200 nm is formed on a surface of a sapphire substrate (0001) by using a pulsed laser deposition method, and four samples are prepared for contrasting an impact of different implantation dosages on the phase-transition temperature. One of the four samples is used as an original sample, and Ne ions are implanted into the other three samples. An implantation energy is 100 keV, and implantation dosages are respectively D1, D2, and D3, where D1<D2<D3, and no annealing is performed after the gaseous ions are implanted. Subsequently, electrical measurement is performed on the vanadium dioxide sample into which no Ne ion is implanted and the vanadium dioxide samples with three different implantation dosages. In this embodiment, an implantation dosage range of Ne ions is preferably 1E10 $cm^{-2}$ to 1E18 $cm^{-2}$. In an example, D1=1E14 $cm^{-2}$, D2=5E14 $cm^{-2}$, and D3=1E15 $cm^{-2}$.

Figure 2:
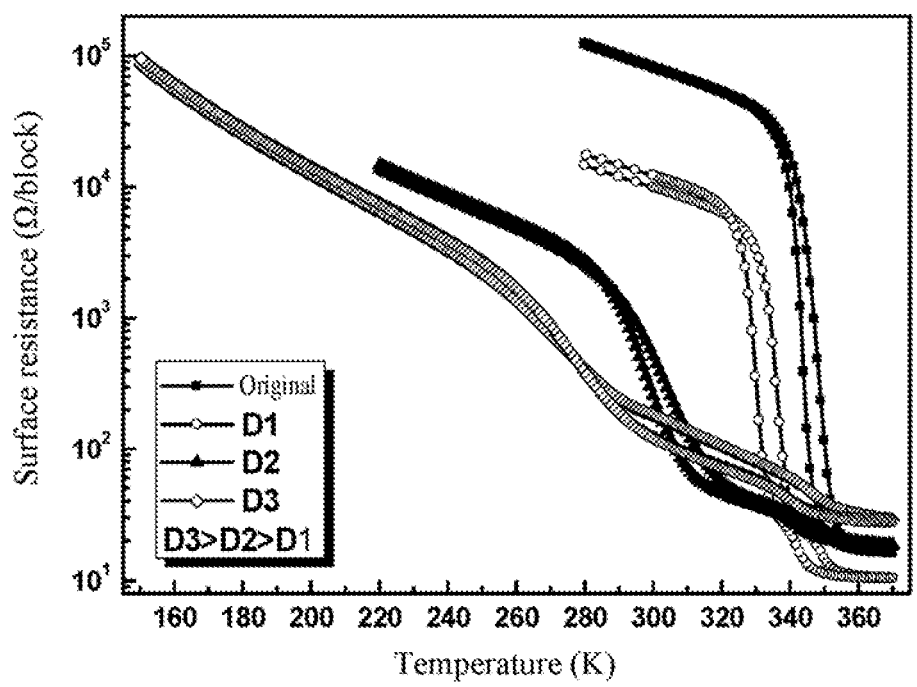
FIG. 2 is a resistance-temperature curve chart before and after Ne ions of different dosages are implanted into a vanadium dioxide thin film.

FIG. 2 is a resistance-temperature curve chart before and after Ne ions of different dosages are implanted into a vanadium dioxide thin film. As shown in FIG. 2, after Ne ions are implanted, a phase-transition temperature of vanadium dioxide is decreased. For example, the resistance of a sample whose implantation dosage is D1 abruptly changes at $57°$ C., and a phase-transition temperature thereof decreases from $68°$ C. to $57°$ C. Similarly, phase-transition temperatures of samples whose implantation dosages are D2 and D3 respectively decrease to $30°$ C. and $0°$ C. It should be noted that the resistance and temperature of the sample whose implantation dosage is D3 presents an exponentially decreasing relationship at a low temperature region (150 K to 250 K). Therefore, the vanadium dioxide thin film can be used as super-sensitive low temperature thermometer or a super-sensitive strain gage.

Figure 3:
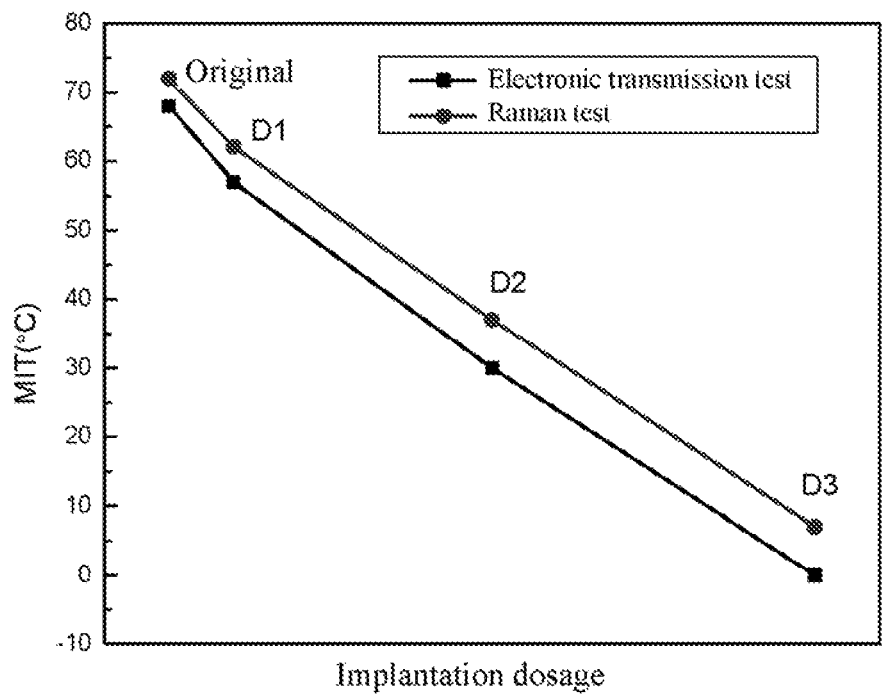
FIG. 3 is a curve chart of a relationship between a phase-transition temperature of a vanadium dioxide thin film and an ion implantation dosage.

FIG. 3 is a curve chart of a relationship between a phase-transition temperature of a vanadium dioxide thin film and an ion implantation dosage. Two test methods are used: an electronic transmission test and a Raman test. It may be learned that two test results tend to be the same. That is, the larger an implantation dosage is, the higher a phase-transition temperature is. Therefore, according to the present invention, a phase-transition temperature of vanadium oxide can be continuously adjusted by changing an implantation dosage of gaseous ions.

It should be noted that, the method for preparing a phase-transition type vanadium oxide material consistent with the present invention is a post-processing process. That is, the vanadium oxide base material is prepared first, and then the gaseous ions are implanted. The obtained phase-transition type vanadium oxide material may be in an original form, for example, in a form of a thin film, a patterned nanostructure, a block, and the like. The patterned nanostructure may be a nanowire or have a shape of other conventional application devices. This may be implemented through commonly-used semiconductor means such as photoetching, developing, and etching. The protection scope of the present invention should not be strictly limited herein. Certainly, the phase-transition type vanadium oxide material obtained after the gaseous ions are implanted may further be ground into powder to perform corresponding application.

In addition, in the foregoing examples, the material of the vanadium oxide base material is pure-phase vanadium oxide. In another embodiment, the material of the vanadium oxide base material may alternatively be vanadium oxide on which doping or other processing is performed. In addition, Ne ions used for implantation may also be replaced with at least one of O, N, H, He, Ar, and Xe.

Further, because the method for preparing a phase-transition type vanadium oxide material consistent with the present invention is a post-processing process, the present invention may be compatible with other methods for adjust the phase-transition temperature. That is, in a process of preparing the vanadium oxide base material, the phase-transition temperature of vanadium oxide may be regulated and controlled in advance in existing manners such as doping a sputtering target or changing an oxygen pressure, and after the vanadium oxide base material whose phase-transition temperature is regulated and controlled in advance is obtained, the phase-transition temperature is further adjusted by using the gaseous ion implantation method in the present invention. When the present invention is combined with other phase-transition temperature adjustment methods, a larger phase-transition temperature adjustment range can be achieved, and the phase-transition temperature of vanadium oxide can be continuously adjusted in a large range from −100° C. to 100° C.

According to the method for preparing a phase-transition type vanadium oxide material consistent with the present invention, only a step of implanting the gaseous ions is needed (where an annealing step may be selectively added to adjust a bubble generation status in vanadium oxide after the gaseous ions are implanted and to further adjust the stress and strain and the phase-transition temperature) in an entire processing procedure, there is no complex processing process, the operation is easy, and the process reproducibility is desirable. In addition, the method for preparing a phase-transition type vanadium oxide material consistent with the present invention has high flexibility, and the phase-transition temperature of vanadium oxide can be continuously adjusted by changing the implantation dosage of the gaseous ions, so that the obtained phase-transition type vanadium oxide material may be applicable to various application fields.

Embodiment 2

This embodiment and Embodiment 1 use basically same technical solutions, and are different in that in Embodiment 1, the phase-transition temperature of the overall vanadium oxide base material is changed, and in this embodiment, only the phase-transition temperature of a local region of the vanadium oxide base material is changed.

Figure 4:
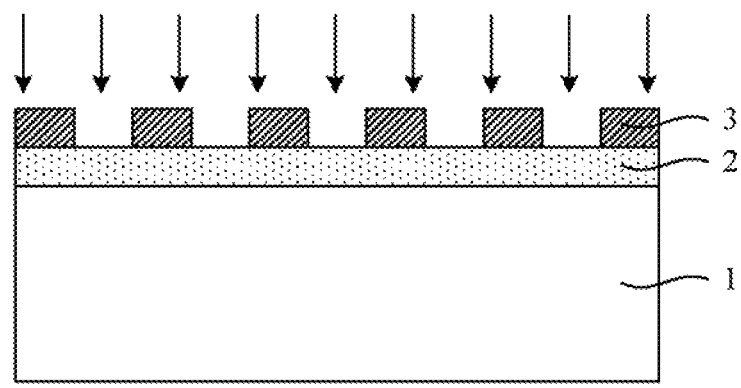
FIG. 4 is a schematic diagram of locally changing a phase-transition temperature of a vanadium dioxide thin film by using a mask.

As shown in FIG. 4, a vanadium dioxide thin film 2 is first prepared on a substrate 1, and then gaseous ions are implanted into the vanadium dioxide thin film 2. When the gaseous ions are implanted, a mask 3 is used. The mask 3 exposes only a local region of the vanadium dioxide thin film 2, so that the gaseous ions are implanted only into the exposed region, so that the phase-transition temperature of the local region of the vanadium oxide base material is changed. The phase-transition type vanadium oxide material whose phase-transition temperature of a local region is changed has a desirable application prospect in aspects of preparing a Thz super material-structure and other vanadium dioxide devices.

In conclusion, the phase-transition type vanadium oxide material and the preparation method therefor consistent with the present invention have the following beneficial effects: (1) High flexibility: In the present invention, gaseous ions are implanted into the vanadium oxide base material, and a stress and strain condition inside the vanadium oxide base material is changed, so that the phase-transition temperature of vanadium oxide is adjusted in an ideal direction. The implantation dosage of the gaseous ions is changed, so that the phase-transition temperature of vanadium oxide can be continuously adjusted. (2) Compatibility with other phase-transition temperature adjustment manners: The present invention is a post-treatment process, the material of the vanadium oxide base material into which the gaseous ions are implanted may be pure phase vanadium oxide or vanadium oxide on which doping or other different processing is performed. Because the gaseous ions are implanted into a prepared vanadium oxide base material, the present invention can be compatible with a method for adjusting the phase-transition temperature such as a method of doping a sputtering target or changing an oxygen pressure in a process of preparing the vanadium oxide base material. The present invention is combined with other phase-transition temperature adjustment methods, so that a larger phase-transition temperature adjustment range can be achieved. (3) Capability of adjusting regional phase-transition temperature: Because in the present invention, the phase-transition temperature is adjusted by implanting the gaseous ions, the gaseous ions may be implanted, by using a mask, in a region that is of the entire vanadium oxide base material and in which the phase-transition temperature needs to be adjusted, thereby adjusting the regional phase-transition temperature of the vanadium oxide base material and providing a new direction for preparation of a vanadium oxide device. (4) Simple steps: Because only a step of implanting the gaseous ions is needed in an entire processing procedure in the present invention, there is no complex processing process, the operation is easy, and the process reproducibility is desirable. Certainly, subsequently, further annealing may be performed to adjust a bubble generation status in vanadium oxide after the gaseous ions are implanted, to further adjust the stress and strain and the phase-transition temperature. Therefore, the present invention effectively overcomes various disadvantages in the prior art and has high industrial utilization value.

The foregoing embodiments are only intended to exemplarily illustrate the principle and effect of the present invention, and not to limit the present invention. A person skilled in the art may make modifications or variations on the foregoing embodiments without departing from the spirit and scope of the present invention. Accordingly, all equivalent modifications or variations implemented by a person of ordinary skill in the art without departing from the spirit and technical concept of the present invention shall be subject to the appended claims of the present invention.

What is claimed is:

1. A method for preparing a phase-transition vanadium oxide material, comprising the following steps:
    providing a vanadium oxide base material, and implanting gaseous ions into the vanadium oxide base material, to obtain a phase-transition vanadium oxide material having a preset phase-transition temperature; wherein the gaseous ions form bubbles in the vanadium oxide base material, and the bubbles change the stress and strain condition inside the vanadium oxide base material.

2. The method for preparing a phase-transition vanadium oxide material as in claim 1, wherein the gaseous ion comprises at least one of O, N, H, He, Ne, Ar, and Xe.

3. The method for preparing a phase-transition vanadium oxide material as in claim 1, wherein the preset phase-transition temperature is regulated and controlled by adjusting an implantation dosage of the gaseous ions.

4. The method for preparing a phase-transition vanadium oxide material as in claim 1, wherein the vanadium oxide base material is a thin film, a patterned nanostructure, or a block.

5. The method for preparing a phase-transition vanadium oxide material as in claim 4, wherein after the gaseous ions are implanted into the vanadium oxide base material, to obtain the phase-transition vanadium oxide material having a preset phase-transition temperature, the phase-transition vanadium oxide material is ground into powder.

6. The method for preparing a phase-transition vanadium oxide material as in claim 1, wherein the gaseous ions are implanted into the vanadium oxide base material by using a mask, to obtain the phase-transition vanadium oxide material having a preset phase-transition temperature in a local region of the vanadium oxide base material.

7. The method for preparing a phase-transition vanadium oxide material as in claim 1, wherein the material of the vanadium oxide base material comprises $VO_2$, $VO$, $V_2O_3$, or $V_2O_5$.

8. The method for preparing a phase-transition vanadium oxide material as in claim 1, wherein the material of the vanadium oxide base material is pure phase vanadium oxide or doped vanadium oxide.

9. The method for preparing a phase-transition vanadium oxide material as in claim 1, wherein the vanadium oxide base material is a vanadium dioxide thin film prepared on a substrate by using a magnetron sputtering method, an ion beam assisted deposition method, a chemical vapor deposition method, a vacuum thermal evaporation method, an electron beam evaporation method, a pulsed laser deposition method, or a solution-gel method.

10. The method for preparing a phase-transition vanadium oxide material as in claim 9, wherein the substrate is quartz glass, ordinary glass, sapphire, a $TiO_2$ substrate, a mica plate, or a silicon wafer.

11. The method for preparing a phase-transition vanadium oxide material as in claim 1, wherein the vanadium oxide base material is a vanadium dioxide thin film, and in a process of preparing the vanadium dioxide thin film, a phase-transition temperature of the vanadium dioxide thin film is regulated and controlled in advance by doping a sputtering target or by changing an oxygen pressure in the preparation process.

12. The method for preparing a phase-transition vanadium oxide material as in claim 1, wherein after the gaseous ions are implanted into the vanadium oxide base material, to obtain the phase-transition vanadium oxide material having a preset phase-transition temperature, the phase-transition vanadium oxide material is further annealed.

13. The method for preparing a phase-transition vanadium oxide material as in claim 12, wherein an annealing temperature range is 25° C. to 1000° C., and an annealing atmosphere comprises at least one of $O_2$ and Ar.

14. The method for preparing a phase-transition vanadium oxide material as in claim 1, wherein a gaseous ion implantation energy range is 50 eV to 1 MeV, a gaseous ion implantation dosage range is 1E1 $cm^{-2}$ to 1E20 $cm^{-2}$, and a gaseous ion implantation temperature range is −100° C. to 1000° C.

* * * * *